(12) United States Patent
Hirabayashi

(10) Patent No.: US 8,648,442 B2
(45) Date of Patent: Feb. 11, 2014

(54) SEMICONDUCTOR DEVICE AND METHOD OF MANUFACTURING THE SAME

(75) Inventor: Seiichi Hirabayashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 464 days.

(21) Appl. No.: 12/037,620

(22) Filed: Feb. 26, 2008

(65) Prior Publication Data
US 2008/0203532 A1 Aug. 28, 2008

(30) Foreign Application Priority Data

Feb. 26, 2007 (JP) .................. 2007-045633

(51) Int. Cl.
*H01L 29/00* (2006.01)

(52) U.S. Cl.
USPC ............ 257/538; 257/E29.001; 257/E21.495; 438/643

(58) Field of Classification Search
USPC .......................................... 257/536; 438/382
See application file for complete search history.

(56) References Cited

U.S. PATENT DOCUMENTS

| | | | | |
|---|---|---|---|---|
| 6,228,735 B1 * | 5/2001 | Lee | ............................... | 438/384 |
| 6,326,256 B1 * | 12/2001 | Bailey et al. | .................. | 438/238 |
| 6,369,409 B1 * | 4/2002 | Takasu et al. | ................... | 257/60 |
| 6,566,721 B2 * | 5/2003 | Takasu | .......................... | 257/380 |
| 6,812,108 B2 * | 11/2004 | Hemmenway et al. | ....... | 438/385 |
| 7,531,877 B2 * | 5/2009 | Takasu | .......................... | 257/347 |
| 2005/0106830 A1 * | 5/2005 | Shiiki et al. | ................... | 438/382 |
| 2006/0027892 A1 * | 2/2006 | Yamashita et al. | ............ | 257/536 |
| 2006/0033164 A1 * | 2/2006 | Takasu | .......................... | 257/360 |

FOREIGN PATENT DOCUMENTS

JP 2006-222410 A 8/2006

* cited by examiner

*Primary Examiner* — David Vu
*Assistant Examiner* — Jonathan Han
(74) *Attorney, Agent, or Firm* — Brinks Gilson & Lione

(57) ABSTRACT

A semiconductor device having a transistor circuit and a bleeder resistance circuit is provided in which fluctuations in resistance value of a bleeder resistor are reduced. In the transistor circuit, a barrier metal film and a interconnect film are layered as a metal film on an interlayer insulating film above transistor structure. In the bleeder resistance circuit, the interconnect film is layered as a metal film on the interlayer insulating film above the bleeder resistor formed from polysilicon film. Alternatively, the metal film in the bleeder resistance circuit includes the barrier metal film only in a portion where the metal film is connected to the bleeder resistor. This reduces stress to the bleeder resistor formed from a polysilicon film, and the resistance value of the bleeder resistor accordingly fluctuates less. In addition, since the metal film used as interconnect of the transistor circuit includes the barrier metal film, interconnect reliability is not impaired.

11 Claims, 11 Drawing Sheets

Interconnect layer is etched to form interconnect

SEMICONDUCTOR DEVICE AND METHOD OF MANUFACTURING THE SAME

RELATED APPLICATIONS

This application claims priority under 35 U.S.C. §119 to Japanese Patent Application No. JP2007-045633 filed Feb. 26, 2007, the entire content of which is hereby incorporated by reference.

BACKGROUND OF THE INVENTION

1. Field of the Invention

The present invention relates to a semiconductor device having a transistor circuit and a bleeder resistance circuit, and a method of manufacturing the semiconductor device. More particularly, the present invention relates to reduction of fluctuation in resistance value of a bleeder resistor.

2. Description of the Related Art

In power supply ICs, polysilicon is commonly used for bleeder resistors, and shift in resistance value of the bleeder resistors has critical influence on the overall characteristics of the IC. Metal film placed above a bleeder resistance circuit is not used as an interconnect, but is used mostly to stabilize the resistance value of the bleeder resistor by being connected in a manner that gives the metal film the same electric potential as that of the bleeder resistor to stabilize an electric field in its vicinity (JP09-321229A). A conductor below the bleeder resistor is also connected in a manner that gives the conductor the same electric potential as that of the bleeder resistor.

Semiconductor devices that have a transistor circuit and a bleeder resistance circuit employ a film that is used commonly to form metal interconnect as it is for the metal film placed above the bleeder resistance circuit. The metal film accordingly has a structure of anti-reflection film/interconnect film/barrier metal film (JP2006-222410A).

The anti-reflection film, which is the topmost layer and is formed of a-Si, TiN, TiW, or the like, is sometimes omitted according to necessity. The interconnect film below the anti-reflection film is formed of aluminum containing a few percents of Si or Cu. The barrier metal film below the interconnect film is a TiN/Ti laminated film or a TiW film.

The barrier metal film has high stress as well as high barrier property, and causes the resistance value of the underlying polysilicon film which forms the bleeder resistor to fluctuate by means of stress. Arranging the barrier metal film above the bleeder resistor could therefore make the voltage division ratio of the bleeder resistor deviate from the correct value.

SUMMARY OF THE INVENTION

The present invention solves the above problem by removing the barrier metal film completely from the bleeder resistance circuit, or by leaving the barrier metal film only in a junction portion of a resistor while removing the barrier metal film from the rest of the bleeder resistor region.

On the other hand, the present invention does not make any changes to the metal film that is used as interconnection of the transistor circuit from the conventional anti-reflection film/interconnect film/barrier metal film structure, from the viewpoint of interconnection reliability.

In order to solve the problem, according to a first aspect of the present invention, there is provided a semiconductor device including a transistor circuit obtained by layering a metal film on an interlayer insulating film above a transistor structure; and a bleeder resistance circuit obtained by layering a metal film on the interlayer insulating film above a bleeder resistor formed from a polysilicon film, in which the metal film layered in the transistor circuit includes a barrier metal film and a interconnect film, and the metal film layered in the bleeder resistance circuit includes the interconnect film.

In order to solve the problem, according to a second aspect of the present invention, there is provided a semiconductor device including a transistor circuit obtained by layering a metal film on an interlayer insulating film above a transistor structure; and a bleeder resistance circuit obtained by layering a metal film on the interlayer insulating film above a bleeder resistor formed from a polysilicon film, in which the metal film layered in the transistor circuit includes a barrier metal film and a interconnect film, and the metal film layered in the bleeder resistance circuit includes the interconnect film except that a portion of the metal film where the metal film is connected to the bleeder resistor includes the barrier metal film.

In order to solve the problem, according to a third aspect of the present invention, there is provided a semiconductor device in which the metal films in the semiconductor device according to one of the first aspect and the second aspect of the present invention include a anti-reflection film if necessary.

In order to solve the problem, according to a fourth aspect of the present invention, there is provided a semiconductor device manufacturing method for manufacturing the semiconductor device according to the first aspect of the present invention, including the steps of: forming a barrier metal layer and a interconnect film on the interlayer insulating film as the metal films above the transistor structure and the bleeder resistor; and removing the barrier metal layer from the bleeder resistance circuit, while leaving the barrier metal layer in the transistor structure.

In order to solve the problem, according to a fifth aspect of the present invention, there is provided a semiconductor device manufacturing method for manufacturing the semiconductor device according to the second aspect of the present invention, including the steps of: forming a barrier metal layer and a interconnect film on the interlayer insulating film as the metal films above the transistor structure and the bleeder resistor; and removing the barrier metal layer from the bleeder resistance circuit, except for a portion where the barrier metal layer is connected to the bleeder resistor, while leaving the barrier metal layer in the transistor structure.

In order to solve the problem, according to a sixth aspect of the present invention, there is provided a semiconductor device in which the metal films in the semiconductor device manufacturing method according to one of the fourth aspect and the fifth aspect of the present invention include a anti-reflection film if necessary.

In the present invention, with no barrier metal film layered on the bleeder resistor, or with a barrier metal film layered on only a part of the bleeder resistor, decrease of stress to the bleeder resistor which is formed from a polysilicon film suppresses fluctuation in the resistance value of the bleeder resistor. Existence of a barrier metal film in the metal film used for interconnect in the transistor circuit can maintain the interconnect reliability.

DETAILED DESCRIPTION OF THE PREFERRED EMBODIMENTS

Aspects described below as embodiments are the best modes of carrying out the present invention.

First Embodiment

Figure 1:
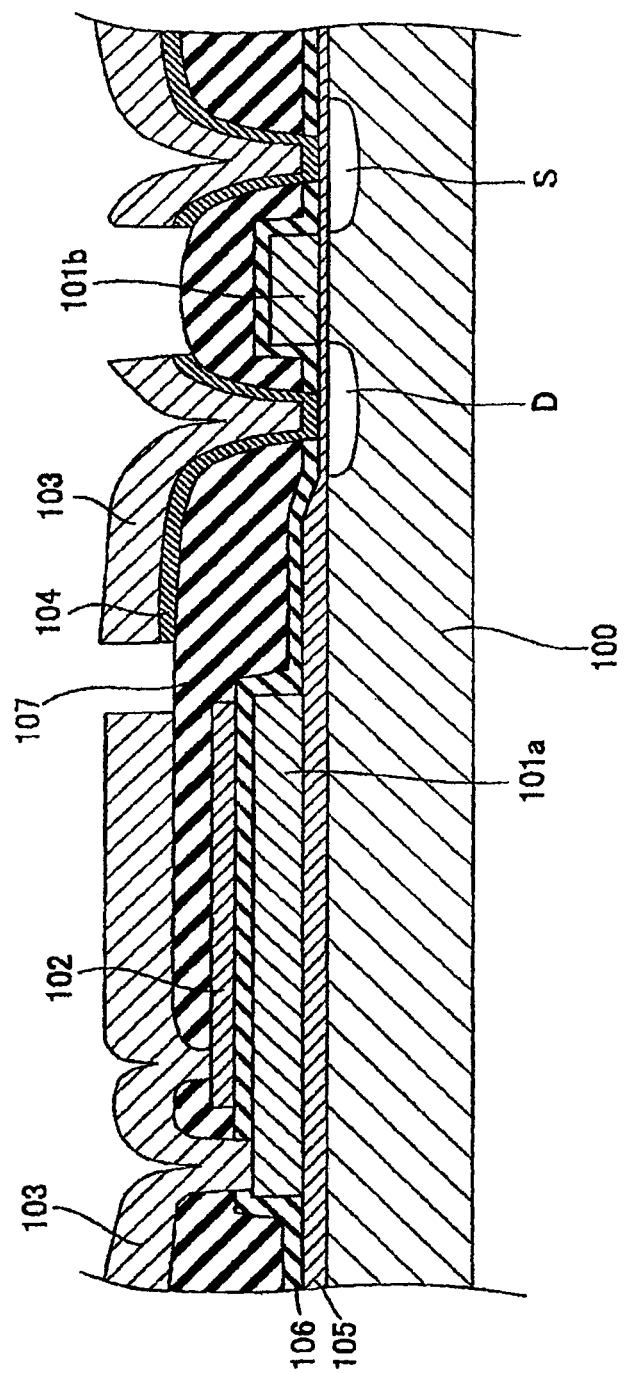
FIG. 1 is a sectional view of a semiconductor device according to a first embodiment of the present invention.

A semiconductor device according to a first embodiment of the present invention will be described with reference to FIG. 1. FIG. 1 is a sectional view of a semiconductor device according to this embodiment, and the right hand side of the drawing shows a transistor circuit whereas the left hand side of the drawing shows a bleeder resistance circuit.

As shown in FIG. 1, in this embodiment, the components of the bleeder resistance circuit are arranged such that an interlayer insulating film 107 is placed on a bleeder resistor 102 while a anti-reflection film (omitted from the drawing) and a interconnect film 103 are placed as a metal film on the interlayer insulating film 107.

Specifically, a shield electrode 101a is formed from a first layer polysilicon film on a field oxide film 105, which is formed on a silicon substrate 100, and an insulating film (oxide film) 106 is formed on the shield electrode 101a. Above the shield electrode 101a, a second layer polysilicon film, which serves as the bleeder resistor 102 constituting the bleeder resistance circuit, is formed with the insulating film 106 interposed between the shield electrode 101a and the second layer polysilicon film. The insulating film 106 is for insulating the first layer polysilicon film and the second layer polysilicon film from each other. The field oxide film 105 is for separating the transistor forming region and the bleeder resistor region from each other.

Above the shield electrode 101a and the bleeder resistor 102, the interlayer insulating film 107 is layered and an interconnect film 103 is placed as a metal film on the interlayer insulating film 107. The interlayer insulating film 107 is for insulating the polysilicon film and the interconnect layer 103 from each other, and is an oxide film formed by CVD, or the like. The interconnect layer 103 is partially connected to the shield electrode 101a and the bleeder resistor 102. Placed on the interconnect film 103 is the anti-reflection film (omitted from the drawing).

Thus, only the interlayer insulating film 107 is layered on the bleeder resistor 102. Absence of barrier metal film, which is a high stress film, causes little stress to the bleeder resistor 102 which is formed from a polysilicon film, and suppresses fluctuation of the resistance value of the bleeder resistor 102.

In the transistor circuit, on the other hand, the interlayer insulating film 107 is placed above a transistor structure and a metal film formed of a anti-reflection film (omitted from the drawing), the interconnect film 103, and a barrier metal film 104 is placed on the interlayer insulating film 107 as shown in FIG. 1.

Specifically, a gate electrode 101b is formed from the first layer polysilicon film on the field oxide film 105, which is formed on the silicon substrate 100, and the insulating film (oxide film) 106 is formed on the gate electrode 101b. A drain (source) region D and a source (drain) region S, which, together with the gate electrode 101b, constitute the transistor circuit, are formed on the silicon substrate 100 to the left and right of the gate electrode 101b. The field oxide film 105 separates the transistor forming region and the bleeder resistor region from each other, and serves as a gate oxide film below the gate electrode 101b.

The interlayer insulating film 107 is layered over the drain region D and the source region S. The barrier metal film 104 and the interconnect film 103 are placed as a metal film on the interlayer insulating film 107. The interlayer insulating film 107 insulates the polysilicon film and the interconnect layer 103 from each other, and is an oxide film formed by CVD, or the like. The interconnect layer 103 is connected to the drain region D and the source region S through the barrier metal film 104. The anti-reflection film (omitted from the drawing) is placed on the interconnect film 103. The interlayer insulating film 107 insulates the polysilicon film and the interconnect layer from each other, and is an oxide film formed by CVD, or the like.

In short, the present invention does not make any changes from the conventional structure formed of the anti-reflection film, the interconnect film 103, and the barrier metal film 104 to the metal film that is used as interconnect of the transistor circuit, from the viewpoint of interconnect reliability.

The anti-reflection film which constitutes the topmost layer of the metal films can be omitted from the transistor circuit and the bleeder resistance circuit both if needed. Also, the transistor circuit can be a power supply IC (for example, a voltage detector) that uses a bleeder resistor.

As has been described, according to this embodiment in which the metal film placed above the bleeder resistor 102 in the bleeder resistance circuit does not include a barrier metal film, less stress is applied to the underlying bleeder resistor 102, and the resistance value of the bleeder resistor 102 fluctuates less. A bleeder resistor with high precision can thus be obtained.

The metal film that is used as interconnect of the transistor circuit, on the other hand, includes the barrier metal film 104 and the reliability of interconnection is therefore not impaired.

Second Embodiment

Figure 2:
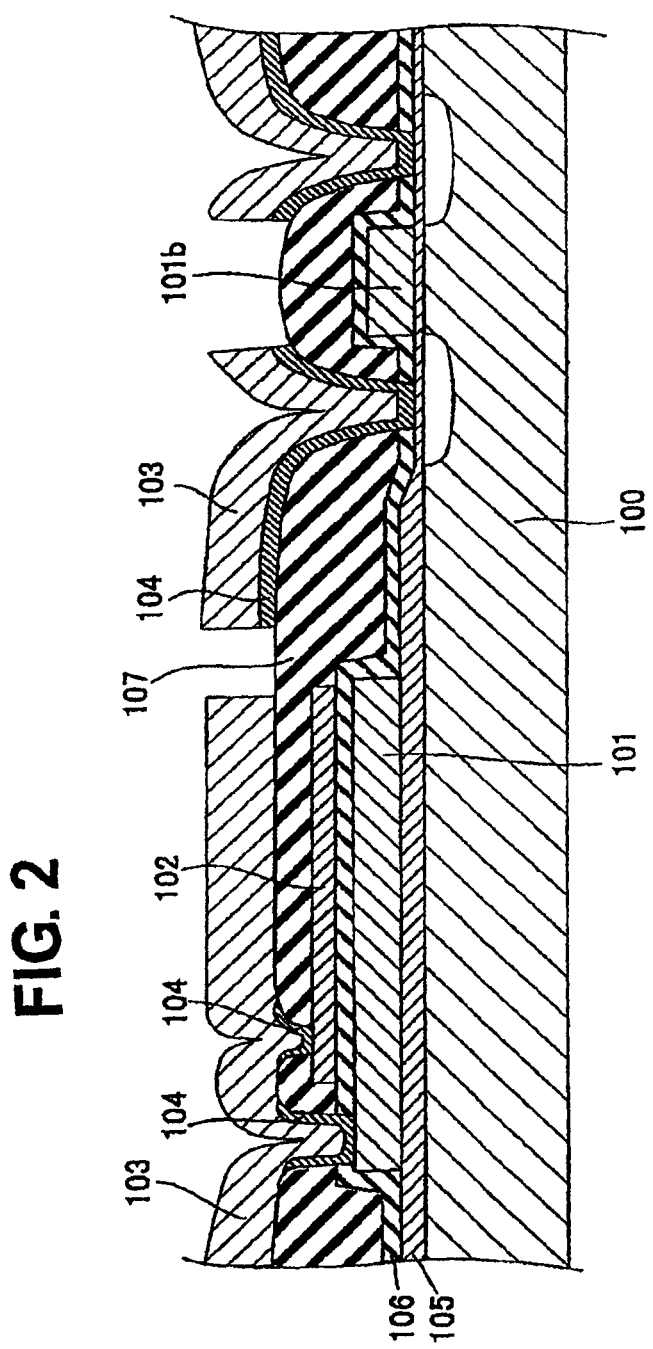
FIG. 2 is a sectional view of a semiconductor device according to a second embodiment of the present invention.

A semiconductor device according to a second embodiment of the present invention will be described with reference to FIG. 2. FIG. 2 is a sectional view of a semiconductor device according to this embodiment, and the right hand side of the drawing shows a transistor circuit whereas the left hand side of the drawing shows a bleeder resistance circuit.

In this embodiment, the components of the bleeder resistance circuit are arranged such that an interlayer insulating film 107 is placed on a bleeder resistor 102 while a anti-reflection film (omitted from the drawing) and a interconnect film 103 are placed as a metal film on the interlayer insulating film 107. A barrier metal film 104 is formed once and then removed from the bleeder resistor region except for a portion where the bleeder resistor 102 and the interconnect film 103 are connected to each other.

In the transistor circuit, on the other hand, the interlayer insulating film 107 is placed above a transistor structure and a metal film formed of the anti-reflection film (omitted from the drawing), the interconnect film 103, and the barrier metal film 104 is placed on the interlayer insulating film 107.

The bleeder resistor 102 in this embodiment is connected to the interconnect film 103 through the barrier metal film 104 and therefore cannot avoid receiving stress from the barrier metal film 104. However, since the barrier metal film 104 is limited to the portion of the bleeder resistor 102 in which the bleeder resistor 102 is connected to the interconnect film 103 while the rest of the bleeder resistor region is free of the barrier metal film 104, the stress influence of the barrier metal film 104 over the bleeder resistor 102 is minimized and fluctuations in resistance value of the bleeder resistor 102 are reduced. A bleeder resistor with high precision is thus obtained. Additional advantage is that the barrier metal film 104 ensures the reliability of interconnection.

The rest of the second embodiment of the present invention is identical with the first embodiment of the present invention described above, and repetitive descriptions are omitted by using the same reference symbols in the first and second embodiments of the present invention to denote the same components.

Third Embodiment

A method of manufacturing a semiconductor device according to a third embodiment of the present invention will be described with reference to FIGS. 3 to 11. FIGS. 3 to 11 are sectional views showing semiconductor device manufacturing process steps according to this embodiment, and the right hand side of the drawings shows a transistor circuit whereas the left hand side of the drawings shows a bleeder resistance circuit.

Figure 3:
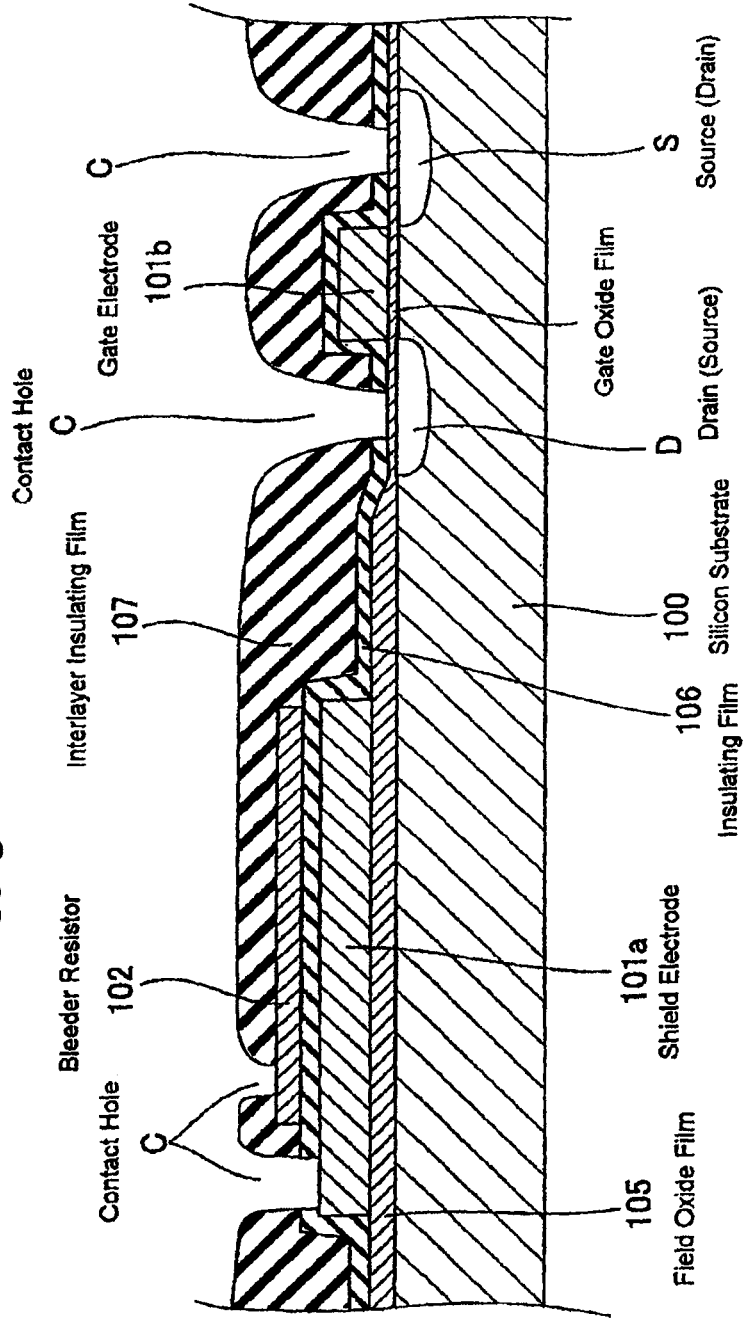
FIG. 3 is a sectional view of a semiconductor device according to a third embodiment of the present invention showing a step of manufacturing method.

FIG. 3 shows a pre-process step in which a field oxide film 105 is formed on a silicon substrate 100, a shield electrode 101a is formed in the bleeder resistor region from a first layer polysilicon film formed on the field oxide film 105, a gate electrode 101b is formed in the transistor circuit region from the first layer polysilicon film on the field oxide film 105, and an insulating film (oxide film) 106 is formed on the first layer polysilicon film. A drain (source) region D and a source (drain) region S, which, together with the gate electrode 101b, constitute the transistor circuit, are formed on the silicon substrate 100 to the left and right of the gate electrode 101b. A second layer polysilicon film is formed as a bleeder resistor 102, which constitutes the bleeder resistance circuit, above the shield electrode 101a with the insulating film 106 interposed between the shield electrode 101a and the second layer polysilicon film.

The insulating film 106 insulates the first layer polysilicon film and the second layer polysilicon film from each other. An interlayer insulating film 107 is layered over the shield electrode 101a, the bleeder resistor 102, the drain (source) region D, and the source (drain) region S, each of which has a contact hole C opened for electric connection in the interlayer insulating film 107. The interlayer insulating film 107 insulates the polysilicon film and a interconnect layer from each other, and is an oxide film formed by CVD, or the like.

Figure 4:
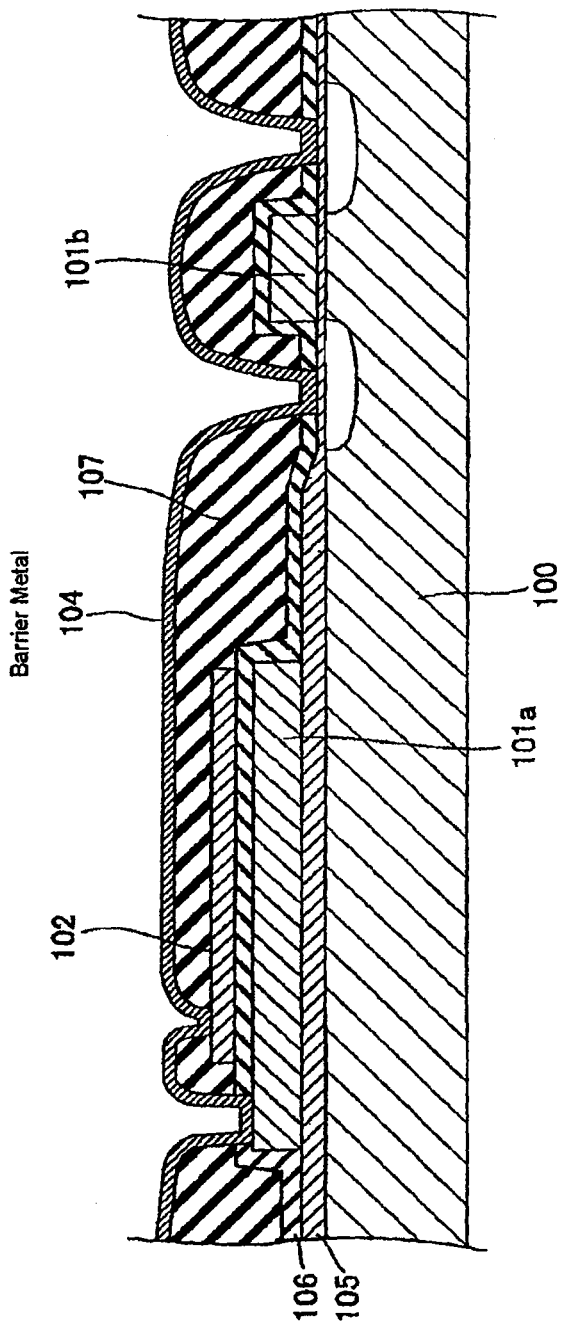
FIG. 4 is a sectional view of a semiconductor device according to a third embodiment of the present invention showing a step of manufacturing method.
Figure 5:
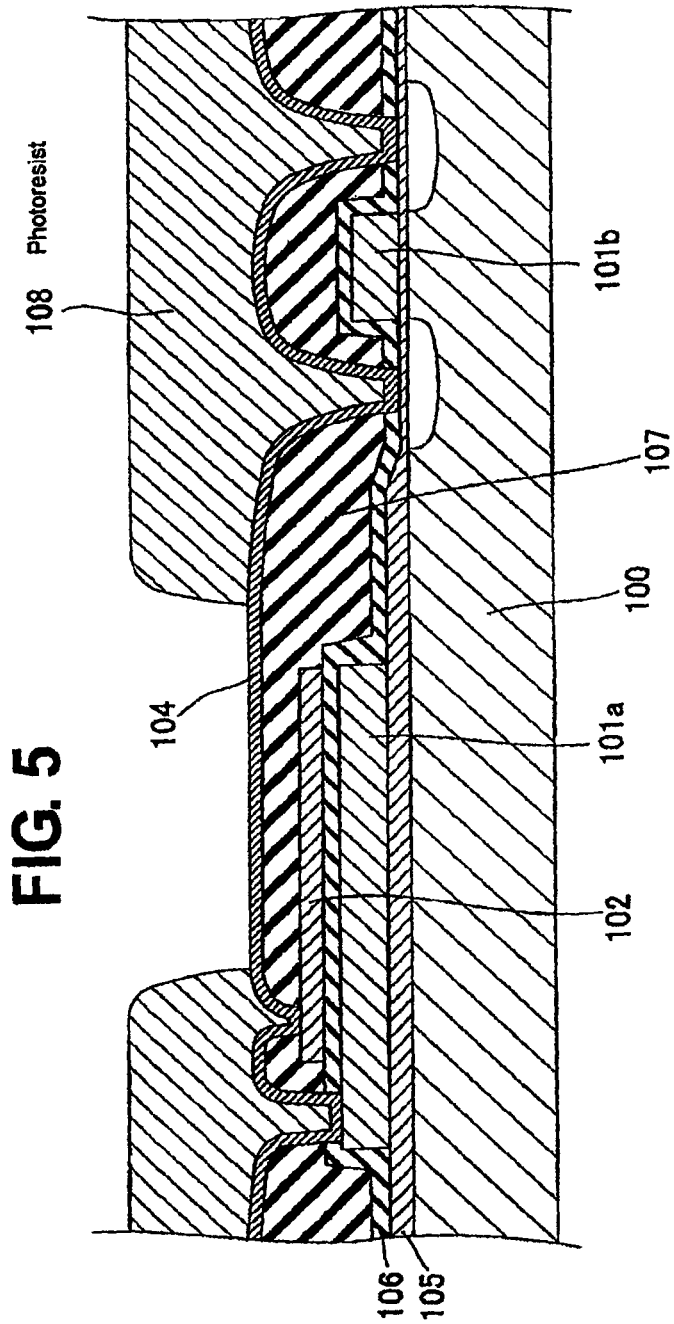
FIG. 5 is a sectional view of a semiconductor device according to a third embodiment of the present invention showing a step of manufacturing method.

First, as shown in FIG. 4, a barrier metal film 104 is layered on the interlayer insulating film 107 and within the contact holes C. As shown in FIG. 5, a layer of a photoresist 108 is layered on the barrier metal film 104. FIG. 5 shows a state in which the photoresist application, exposure to light, and development have been finished, and an opening has been formed in the photoresist 108 of FIG. 5 in the bleeder resistor region excluding the contact hole C.

Figure 6:
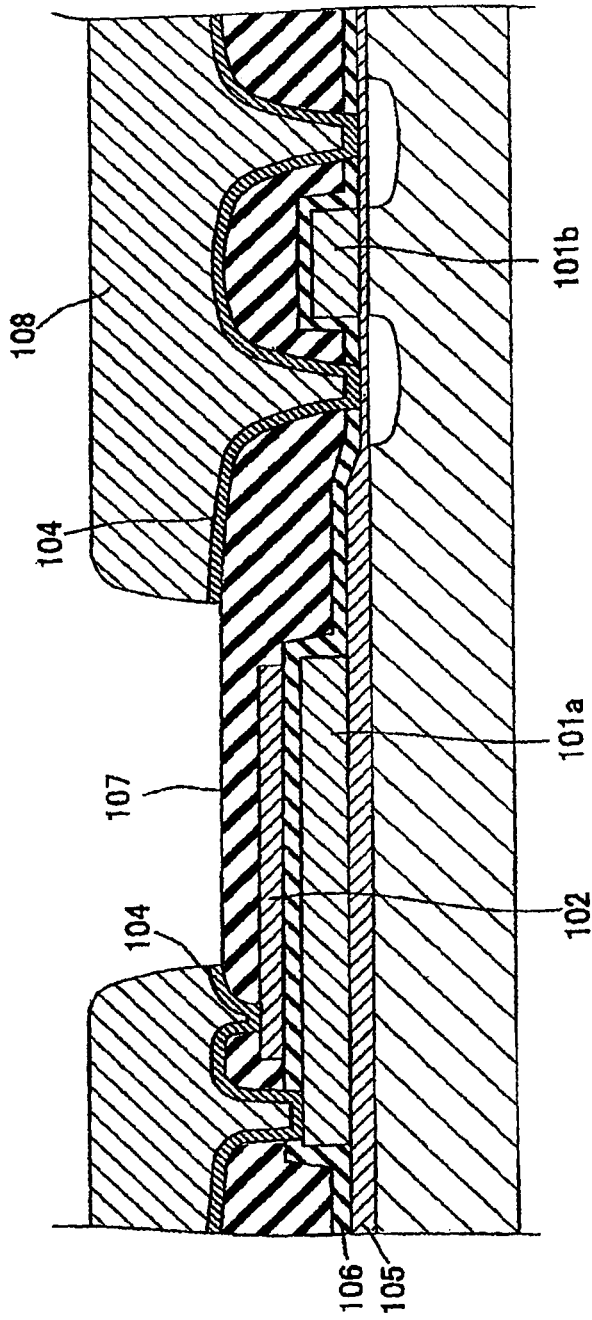
FIG. 6 is a sectional view of a semiconductor device according to a third embodiment of the present invention showing a step of manufacturing method.

Next, as shown in FIG. 6, the photoresist 108 is used as a mask for partial removal of the barrier metal film 104 to remove the barrier metal film 104 from the opening by etching. The etching exposes a portion of the interlayer insulating film 107 in the opening in the photoresist 108. The etching does not remove the barrier metal film 104 from the transistor circuit region, and the barrier metal film 104 also remains in a portion of the bleeder register circuit region that surrounds the region's contact hole C.

Figure 7:
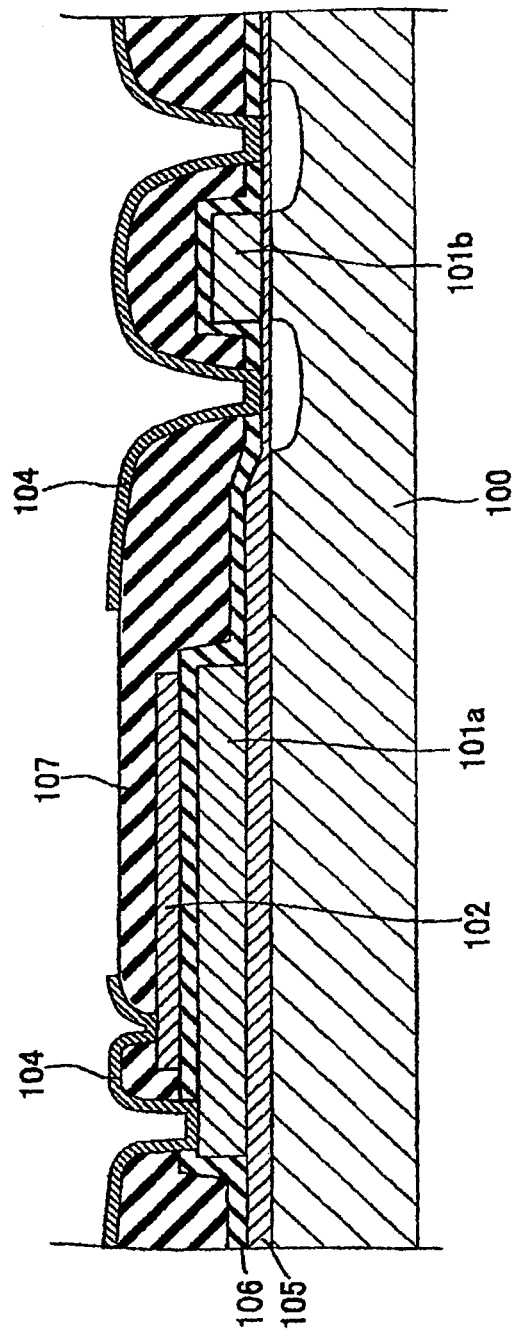
FIG. 7 is a sectional view of a semiconductor device according to a third embodiment of the present invention showing a step of manufacturing method.

Subsequently, as shown in FIG. 7, the photoresist 108 is peeled by plasma treatment or the like to expose the barrier metal film 104 in the transistor circuit region and in the portion of the bleeder register circuit region that surrounds the region's contact hole C.

Figure 8:
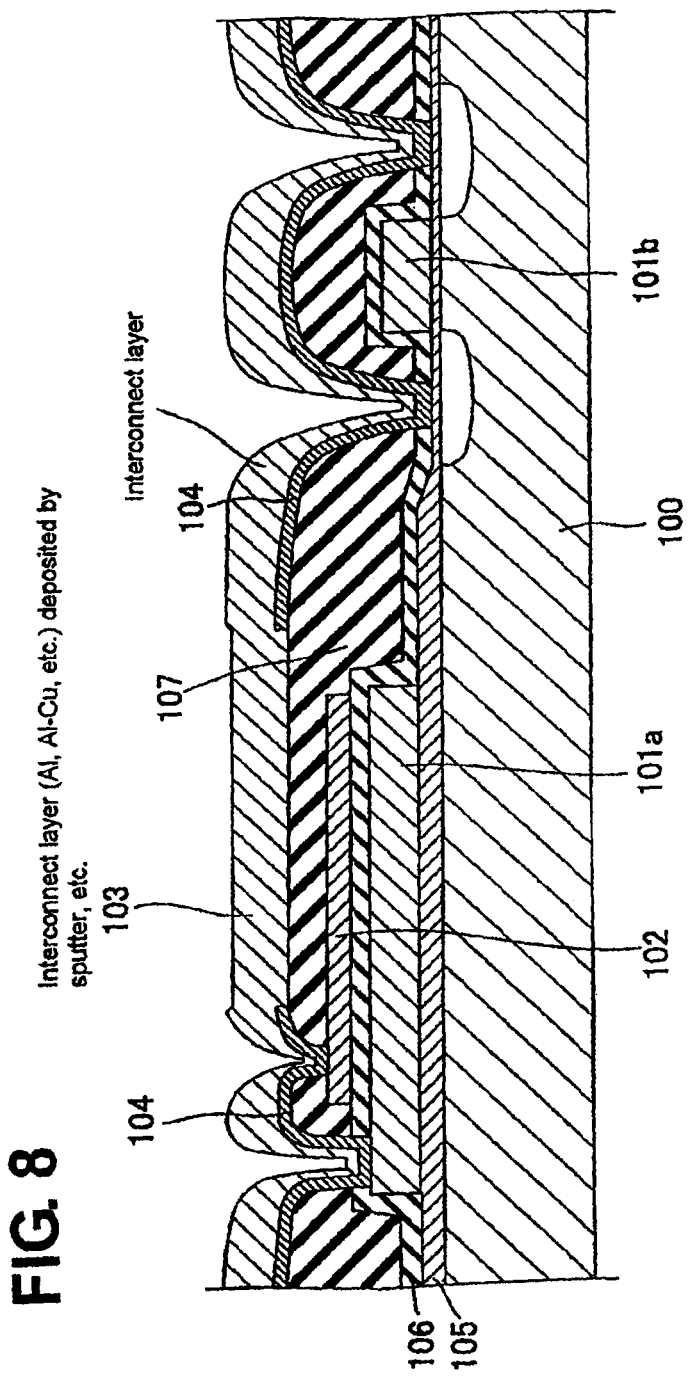
FIG. 8 is a sectional view of a semiconductor device according to a third embodiment of the present invention showing a step of manufacturing method.
Figure 9:
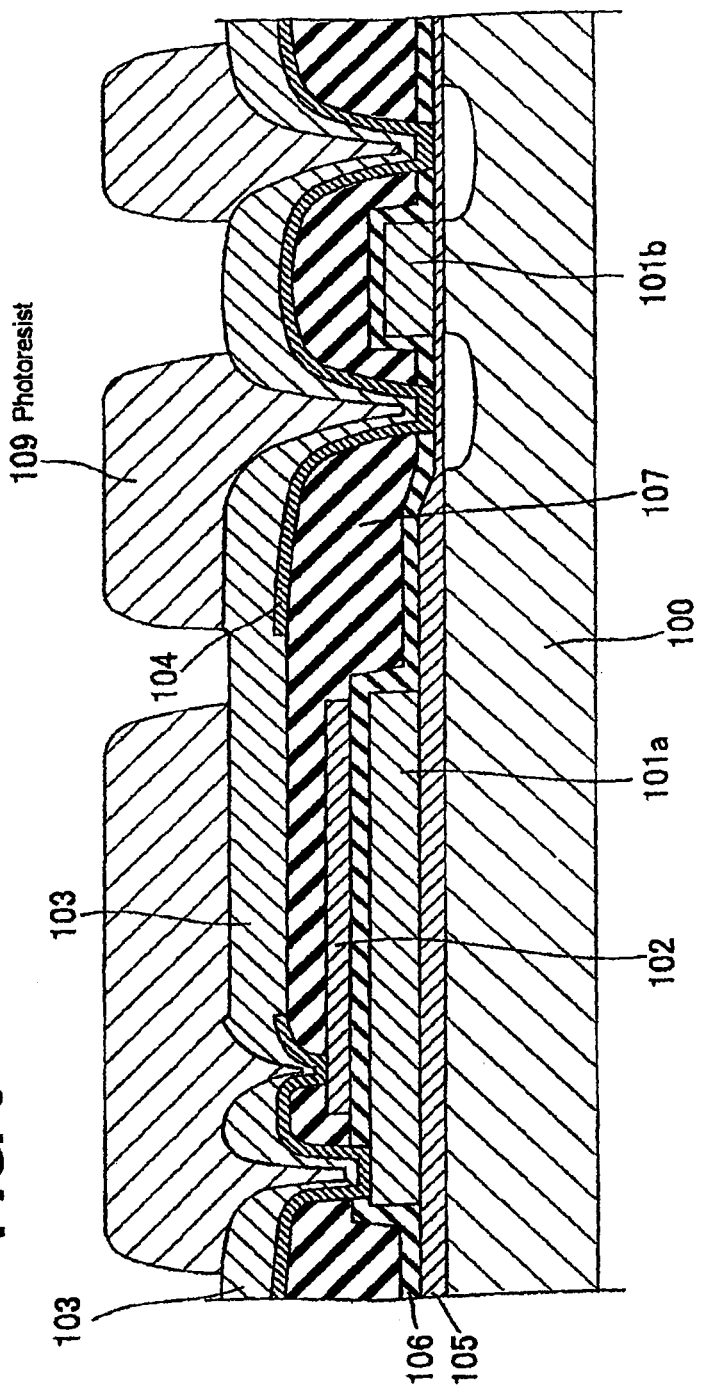
FIG. 9 is a sectional view of a semiconductor device according to a third embodiment of the present invention showing a step of manufacturing method.

Thereafter, as shown in FIG. 8, a interconnect layer 103 is formed on the portion of the interlayer insulating film 107 that has been exposed by the partial removal of the barrier metal film 104 and on the remaining portion of the barrier metal film 104 by depositing Al, Al—Cu, or the like through sputtering or the like. A layer of a photoresist 109 for forming interconnects is then formed by application, exposed to light, and development to be patterned as shown in FIG. 9.

Figure 10:
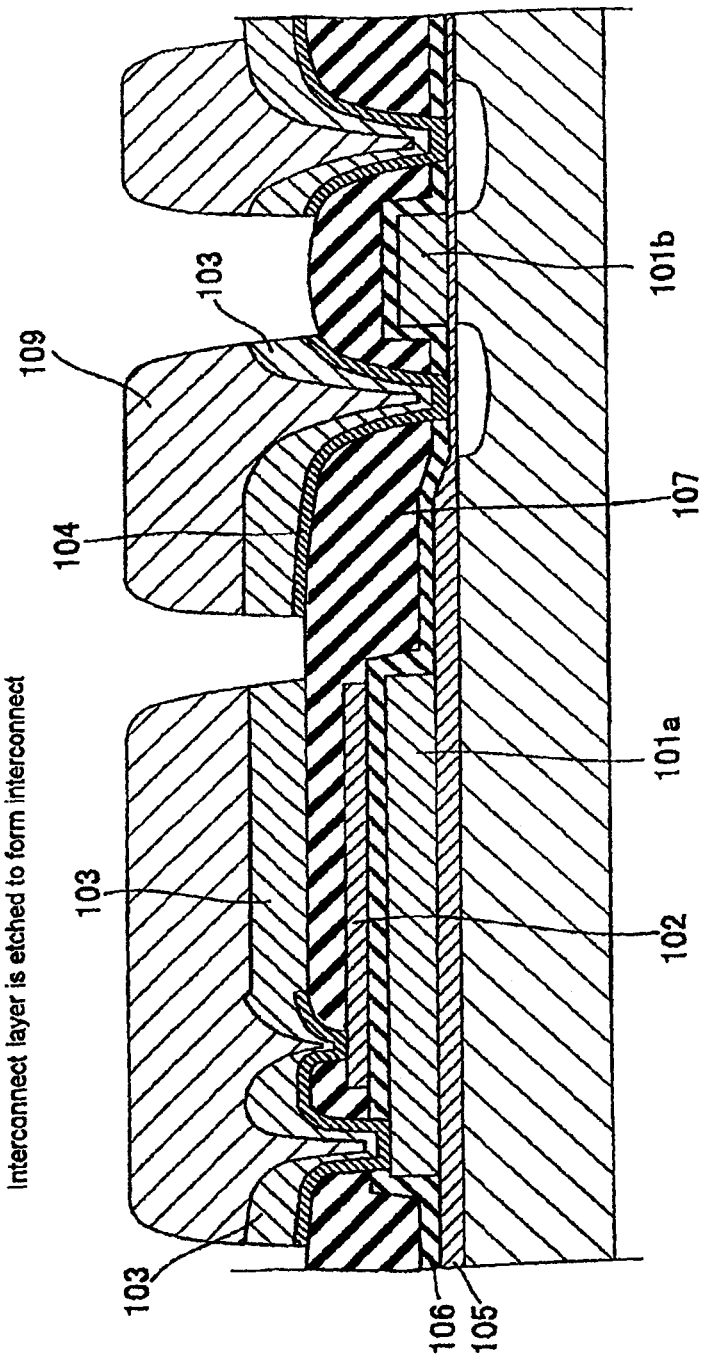
FIG. 10 is a sectional view of a semiconductor device according to a third embodiment of the present invention showing a step of manufacturing method.
Figure 11:
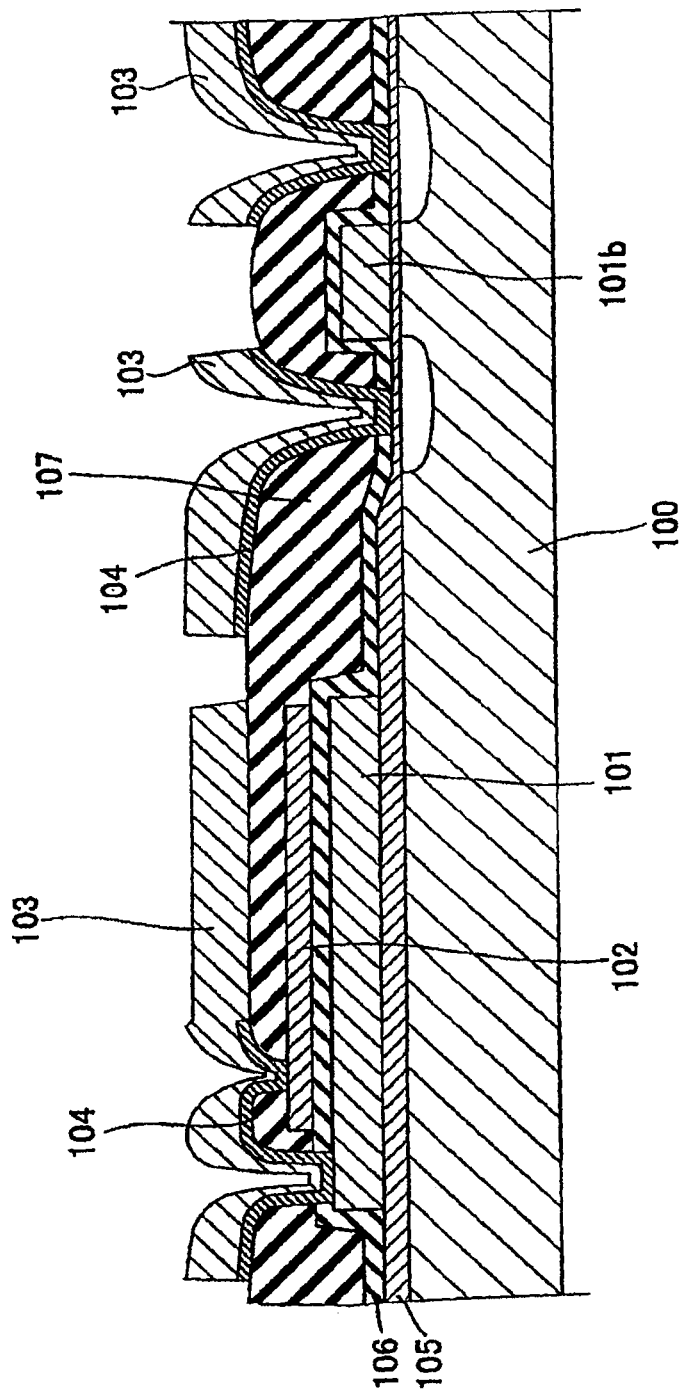
FIG. 11 is a sectional view of a semiconductor device according to a third embodiment of the present invention showing a step of manufacturing method.

As shown in FIG. 10, the photoresist 109 is used as a mask to etch the interconnect layer 103 in order to form interconnect. The photoresist 109 is then peeled by plasma treatment or the like as shown in FIG. 11.

The next step, though illustration is omitted, is to form a passivation film (an insulating film formed mainly of an oxide film) for surface protection.

As has been described, with the semiconductor device manufacturing method according to this embodiment, the barrier metal film 104 and the interconnect film 103 are formed as a metal film on the interlayer insulating film 107 above the transistor region and the bleeder resistor region, and the barrier metal film 104 is then removed from the bleeder resistance circuit, except for a portion where the metal film is connected to the bleeder resistor 102, while left intact in the transistor region. Accordingly, resistance value fluctuations due to stress applied by the barrier metal film 104 which is a high stress film to the bleeder resistor 102 which is formed from a polysilicon film can be minimized.

The above embodiment of the present invention keeps a portion of the barrier metal film 104 where the metal film is connected to the bleeder resistor 102, but the barrier metal film 104 may be removed completely from the bleeder resistor region if interconnect reliability is not a problem.

The present invention, which provides a semiconductor device having a transistor circuit and a bleeder resistance circuit and a method of manufacturing the semiconductor device, has a wide range of industrial applications as a measure to reduce resistance value fluctuations due to stress applied to a bleeder resistor.

What is claimed is:
1. A semiconductor device comprising:
    a transistor circuit obtained by layering a metal film on an interlayer insulating film above a transistor structure; and
    a bleeder resistance circuit obtained by layering a metal film on the interlayer insulating film above a bleeder resistor formed from a polysilicon film, the bleeder resistor formed above a shield electrode;

wherein the metal film layered in the transistor circuit comprises a first barrier metal film and an interconnect film, and wherein the metal film layered in the bleeder resistance circuit comprises the interconnect film and a second barrier metal film, and the second barrier metal film is arranged between the interconnect film and the shield electrode, the second barrier metal film contacting the shield electrode, and the second barrier metal film is arranged only around a connecting portion between the interconnect film and the bleeder resistor and does not further extend in the bleeder resistance circuit.

2. A semiconductor device according to claim 1, wherein the metal films comprise an anti-reflection film.

3. A method for manufacturing a semiconductor device, comprising the steps of:

forming a barrier metal layer on an interlayer insulating film above a transistor structure and a bleeder resistor comprising a shield electrode; and wherein the semiconductor device comprises:

a transistor circuit obtained by layering a metal film on an interlayer insulating film above the transistor structure; and a bleeder resistance circuit obtained by layering a metal film on the interlayer insulating film above the bleeder resistor formed from a polysilicon film and above the shield electrode;

removing a portion of the barrier metal layer from the interlayer insulating film formed on the bleeder resistance circuit, while leaving the barrier metal layer in the transistor circuit, wherein removing the portion of the barrier metal layer comprises leaving the barrier metal layer only in a junction portion of the bleeder resistor and on a portion of the shield electrode, wherein the barrier metal layer contacts the portion of the shield electrode, and removing the barrier metal layer from the rest of the bleeder resistance circuit;

forming an interconnect film on the barrier metal layer and on the interlayer insulating film not covered by the barrier metal layer; and removing a portion of the interconnect film formed on the interlayer insulating film not covered by the barrier metal layer in the bleeder resistance circuit, wherein the interlayer insulating film corresponding to the removed portion of the interconnect film above the bleeder resistor remains, and removing another portion of the interconnect film formed on the barrier metal layer in the transistor circuit.

4. A method according to claim 3, further comprising forming an anti-reflection film on or above the transistor circuit and the bleeder resistance circuit.

5. A method for manufacturing a semiconductor device, wherein the semiconductor comprises a transistor circuit obtained by layering a metal film on an interlayer insulating film above a transistor structure; and a bleeder resistance circuit obtained by layering a metal film on the interlayer insulating film above a bleeder resistor formed from a polysilicon film, the bleeder resistor formed above a shield electrode, wherein the metal film layered in the transistor circuit comprises a first barrier metal film and an interconnect film, and wherein the metal film layered in the bleeder resistance circuit comprises the interconnect film and a second barrier metal film, and the second barrier metal film is arranged between the interconnect film and the shield electrode, the second barrier metal film contacting the shield electrode, and the second barrier metal film is arranged only around a connecting portion between the interconnect film and the bleeder resistor and does not further extend in the bleeder resistance circuit, the method comprising the steps of:

forming the metal films comprising the barrier metal layer on the interlayer insulating film above the transistor structure and the bleeder resistor; and removing the barrier metal layer from the bleeder resistance circuit, except for a portion where the barrier metal layer is connected to the bleeder resistor, while leaving the barrier metal layer in the transistor structure and the shield electrode;

forming an interconnect film on the barrier metal layer and on the interlayer insulating film not covered by the barrier metal layer;

removing a portion of the interconnect film formed on the interlayer insulating film not covered by the barrier metal layer in the bleeder resistance circuit, wherein the interlayer insulating film corresponding to the removed portion of the interconnect film above the bleeder resistor remains, and removing another portion of the interconnect film formed on the barrier metal layer in the transistor circuit.

6. A method according to claim 5, wherein the metal films comprise an anti-reflection film.

7. A semiconductor device comprising:

a bleeder resistance circuit area comprising:
a shield electrode;
a bleeder resistor comprising a polysilicon film and arranged above the shield electrode;
an interlayer insulating film arranged on and above the shield electrode and the bleeder resistor;
an interconnect layer arranged on the interlayer insulating film such that the interconnect layer is insulated from the bleeder resistor by the interlayer insulating film, the interconnect layer contacting a portion of the shield electrode and a portion of the bleeder resistor via a contact hole where the interlayer insulating film is not extended.

8. The device of claim 7, further comprising:

a transistor circuit area comprising:
a transistor circuit comprising a drain, a source and a gate,
a barrier metal layer directly contacting the drain and the source via a contact hole arranged in the transistor circuit area; and
a first interconnect layer arranged on the barrier metal layer and extending along with the barrier metal layer in a same pattern.

9. The device of claim 8, wherein the bleeder resistance circuit area comprises no barrier metal layer, thereby suppressing fluctuation of a resistance value of the bleeder resistor.

10. The device of claim 8, wherein the bleeder resistance circuit area comprises a barrier metal layer arranged only in the contact hole where the interlayer insulating film is not extended, thereby reducing fluctuation of a resistance value of the bleeder resistor.

11. The device of claim 8, wherein the bleeder resistance circuit area comprises a barrier metal layer arranged in a limited area including the contact hole where the interlayer insulating film is not extended, thereby reducing fluctuation of a resistance value of the bleeder resistor.

* * * * *